(12) United States Patent
Ulasyuk

(10) Patent No.: US 9,347,622 B2
(45) Date of Patent: May 24, 2016

(54) LED WHITE LIGHT SOURCE WITH REMOTE PHOTOLUMINESCENT CONVERTER

(76) Inventor: Vladimir Nikolaevich Ulasyuk, Fryazino (RU)

(*) Notice: Subject to any disclaimer, the term of this patent is extended or adjusted under 35 U.S.C. 154(b) by 0 days.

(21) Appl. No.: 13/985,951

(22) PCT Filed: Jan. 23, 2012

(86) PCT No.: PCT/RU2012/000025
§ 371 (c)(1),
(2), (4) Date: Aug. 16, 2013

(87) PCT Pub. No.: WO2012/112073
PCT Pub. Date: Aug. 23, 2012

(65) Prior Publication Data
US 2013/0320834 A1    Dec. 5, 2013

(30) Foreign Application Priority Data

Feb. 17, 2011    (RU) ................................ 2011105809

(51) Int. Cl.
*F21V 9/16*    (2006.01)
*H01J 1/02*    (2006.01)
*H01J 7/24*    (2006.01)
(Continued)

(52) U.S. Cl.
CPC ... *F21K 9/50* (2013.01); *F21K 9/13* (2013.01); *H01L 33/507* (2013.01); *H01L 33/642* (2013.01); *F21V 7/0033* (2013.01); *F21V 29/505* (2015.01); *F21V 29/74* (2015.01); *F21Y 2101/02* (2013.01); *F21Y 2103/003* (2013.01); *H01L 25/0753* (2013.01); *H01L 33/60* (2013.01); *H01L 2224/48091* (2013.01); *H01L 2224/48247* (2013.01)

(58) Field of Classification Search
CPC .......... F21K 9/50; F21K 9/13; H01L 33/507; H01L 33/642; H01L 2224/48247; H01L 2224/48091; H01L 33/60; H01L 25/0753; F21V 29/74; F21V 29/505; F21V 7/0033; F21Y 2103/003; F21Y 2101/02
See application file for complete search history.

(56) References Cited

U.S. PATENT DOCUMENTS

2004/0129945 A1*    7/2004    Uemura .......................... 257/98
2010/0244700 A1*    9/2010    Chong et al. .................. 315/113
(Continued)

FOREIGN PATENT DOCUMENTS

EP    2213233    8/2010
JP    2007243055    9/2007
(Continued)

*Primary Examiner* — Donald Raleigh
(74) *Attorney, Agent, or Firm* — Defillo & Associates, Inc.; Evelyn A Defillo

(57) ABSTRACT

The proposed illuminator relates to white-light lamps based on LEDs with remote phosphor converters. The illuminator comprises a heat removing base with a radiation output opening, and the LEDs secured near the periphery of the opening, with, arranged in series at a distance from the LEDs, a concave phosphor converter layer, wherein the layer's concavity is oriented towards the LED's and the opening. White light formed as mix of reflected LED's radiation and phosphor's radiation exits via the opening, while white light formed as mix of LED's radiation passing through the layer and phosphor's radiation exits through the layer. The layer may have the form of a truncated ellipsoid of revolution, in particular a sphere, or a paraboloid, with a main axis perpendicular to the plane of the opening, or a cylinder truncated by the plane of the opening.

9 Claims, 12 Drawing Sheets

Figure 1:
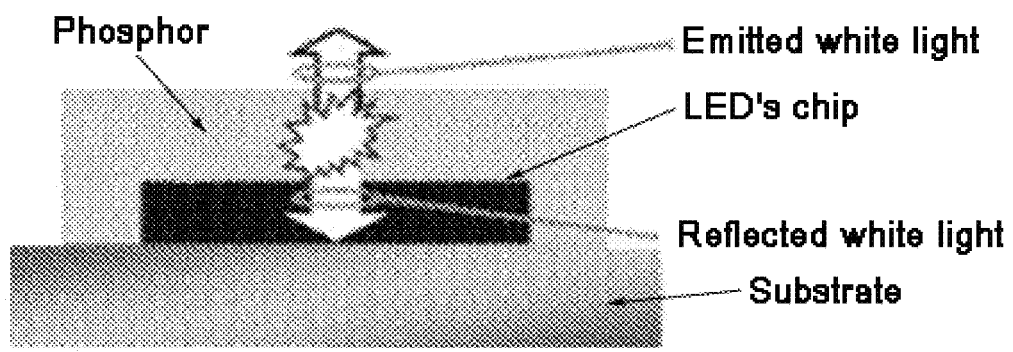

(51) Int. Cl.
*H01J 61/52* (2006.01)
*H01K 1/58* (2006.01)
*F21K 99/00* (2016.01)
*H01L 33/50* (2010.01)
*H01L 33/64* (2010.01)
*H01L 25/075* (2006.01)
*H01L 33/60* (2010.01)
*F21V 7/00* (2006.01)
*F21Y 101/02* (2006.01)
*F21Y 103/00* (2016.01)
*F21V 29/505* (2015.01)
*F21V 29/74* (2015.01)

(56) References Cited

U.S. PATENT DOCUMENTS

2010/0277907 A1* 11/2010 Phipps et al. ............... 362/235
2010/0301367 A1* 12/2010 Nakamura et al. ........... 257/98
2011/0249424 A1* 10/2011 Joo et al. ..................... 362/97.1

FOREIGN PATENT DOCUMENTS

| KR | 20100071957 | * | 6/2010 | ............ H01L 33/50 |
| RU | 2407110 | | 12/2010 | |

* cited by examiner

LED WHITE LIGHT SOURCE WITH REMOTE PHOTOLUMINESCENT CONVERTER

The present invention relates to electrical and electronic equipment, and more particularly to light sources based on semiconductor light-emitting diodes (LEDs), more particularly to a white light source based on LEDs with conversion photoluminescent phosphors.

Solid-state lighting technology is starting to conquer the white lighting market, thanks to recent advances in the development of efficient LEDs, especially nitride (InGaN), and the highest achievable lighting efficiency of all white light sources known in the art. LED solutions are widely used in the lighting apparatus, such as linear and street illuminators wherein the illuminator is relatively large, and intensely heated LEDs can be distributed so as to facilitate the efficient removal of heat from them. The development of LED replacements for standard incandescent and halogen lamps having a small form factor and a high luminous flux, in view of significant prospects for solving the energy saving problem, is one of the most critical scientific and technical tasks; however, its solution is significantly hindered by the limited space for installing the control electronics (drivers) and a relatively small surface area for removal of heat emitted by LEDs in such lamps. White LEDs often include a blue LED coated with YAG:Ce phosphor. High-power (one watt or more) blue LEDs have an efficiency of about 30-45%, with approximately 550-700 mW allocated to unit heating from each applied watt. Furthermore, it is believed that when phosphor converts the blue light into the yellow one in white LEDs, approximately 20% of the incident light energy is spent for phosphor heating. Technical specifications indicate that blue LED radiation power loss is about 7% at the temperature of 25-125° C., while power loss of white LEDs is about 20% at the same temperature. Thus, high-power white LEDs have substantial limitations on heat and luminous fluxes.

The objective of the present invention is to provide a LED lamp with a small form factor, wherein the problems of the known technical solutions have been overcome, to replace standard lamps.

The structure of any LED lamp designed to replace standard white light lamps is based on LED chips. White light results from mixing of radiation emitted from LED chips and different light colors such as blue, green and red, or blue and orange, etc.

However, in recent years LED white light sources with photoluminescent phosphor converters, which radiate yellow or orange (red) light while absorbing blue or UV radiation of LED chip, are becoming the most widespread light sources. FIG. 1 shows a diagram explaining the operating principle of a white light source of this type.

The apparatus comprises a LED chip that emits primary relatively shortwave radiation and a conversion photoluminescent phosphor medium which is irradiated with the said relatively shortwave radiation and which, upon irradiation by the specified relatively shortwave radiation, is excited and emits in response a second radiation with relatively longer waves. In the particular embodiment, the monochrome blue or UV radiation emitting from the chip is converted to white light by placing the chip in organic and/or inorganic phosphors (photoluminescent phosphors) in a polymer matrix.

Figure 2:
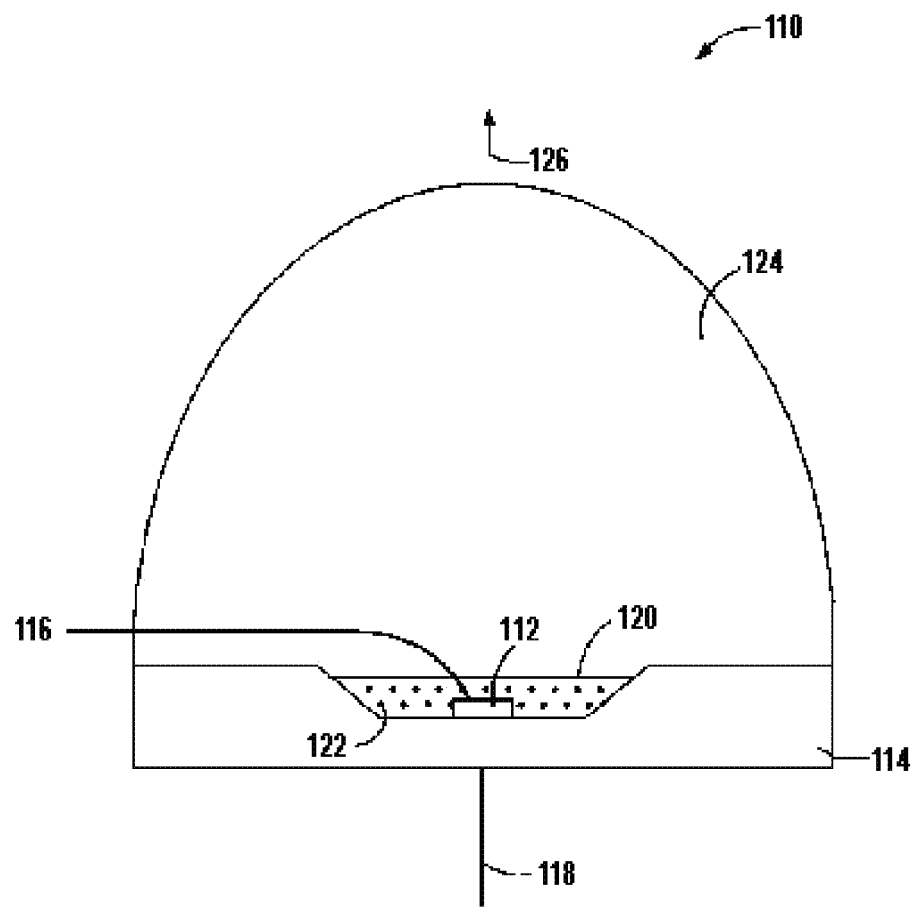

FIG. 2 shows a known LED white light source with photoluminescent phosphor conversion, as described in U.S. Pat. No. 6,351,069.

White light source 110 includes a nitride LED chip 112, which, when excited, emits primary blue radiation. The chip 112 is placed on the conductive frame of the reflector cup 114 and is electrically connected to conductors 116 and 118. Conductors 116 and 118 supply the chip 112 with electric power. The chip 112 is covered with the transparent resin layer 120 that includes conversion material for converting the wavelength of radiation 122. Conversion material type used to form layer 120 can be selected depending on the desired spectral distribution of the secondary radiation produced by material 122. The chip 112 and the fluorescent layer 120 are covered by a lens 124. The lens 124 is typically made of a transparent epoxy or silicone. When using a white light source the voltage is applied to the chip 112, wherein the primary radiation is emitted by the upper surface of the chip. The emitted primary radiation is partially absorbed by the conversion material 122 in the layer 120. Thereafter the conversion material 122, in response to the absorption of the primary light, emits secondary radiation, i.e. converted light having a peak with a longer wavelength. The remaining unabsorbed portion of the emitted primary radiation is transmitted through the conversion layer together with the secondary radiation. The lens 124 directs the unabsorbed primary radiation and the secondary radiation in a general direction indicated by the arrow 126 as outgoing light. Thus, the outgoing light is a complex light which is composed of the primary radiation emitted by the chip 112 and the secondary radiation emitted by the conversion layer 120. The conversion material can also be configured so only a small portion or even all primary light remains in the device as in the case of a chip that emits primary UV light combined with one or more conversion materials emitting visible secondary light.

The aforementioned apparatus known in the art, wherein a photoluminescent phosphor layer is formed on LED surface, has several disadvantages. It is difficult to achieve color uniformity when photoluminescent phosphor is in direct mechanical, optical and thermal contact with the LED surface due to significant changes in the light path length depending on the angle of radiation propagation through the photoluminescent phosphor layer. Furthermore, high temperature of the heated LED can undesirably alter the color coordinates of the photoluminescent phosphor or can lead to its degradation.

Figure 3:
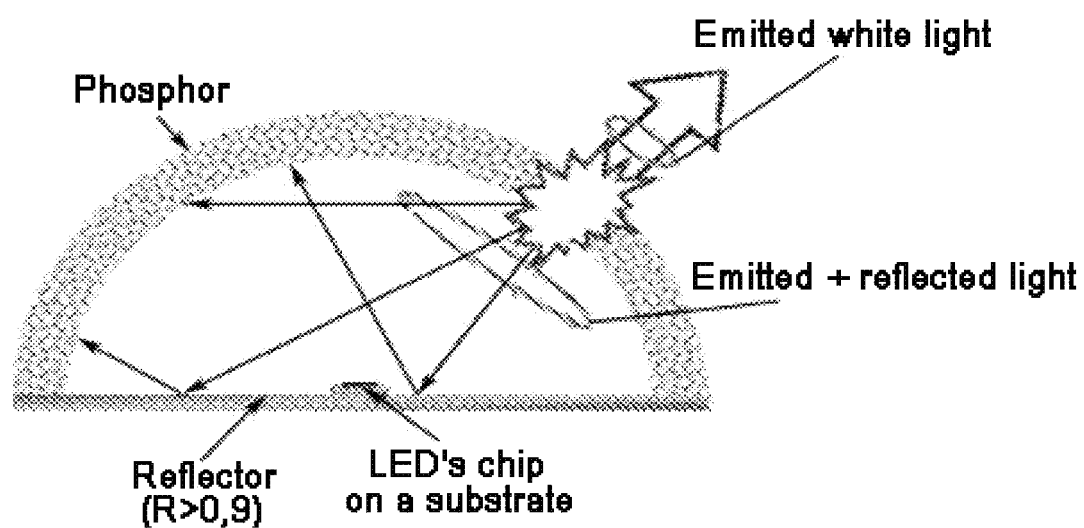

In order to eliminate the specified disadvantages we propose white light sources with a wavelength converter remote from LED, which operating principle is explained in FIG. 3.

Figure 4:
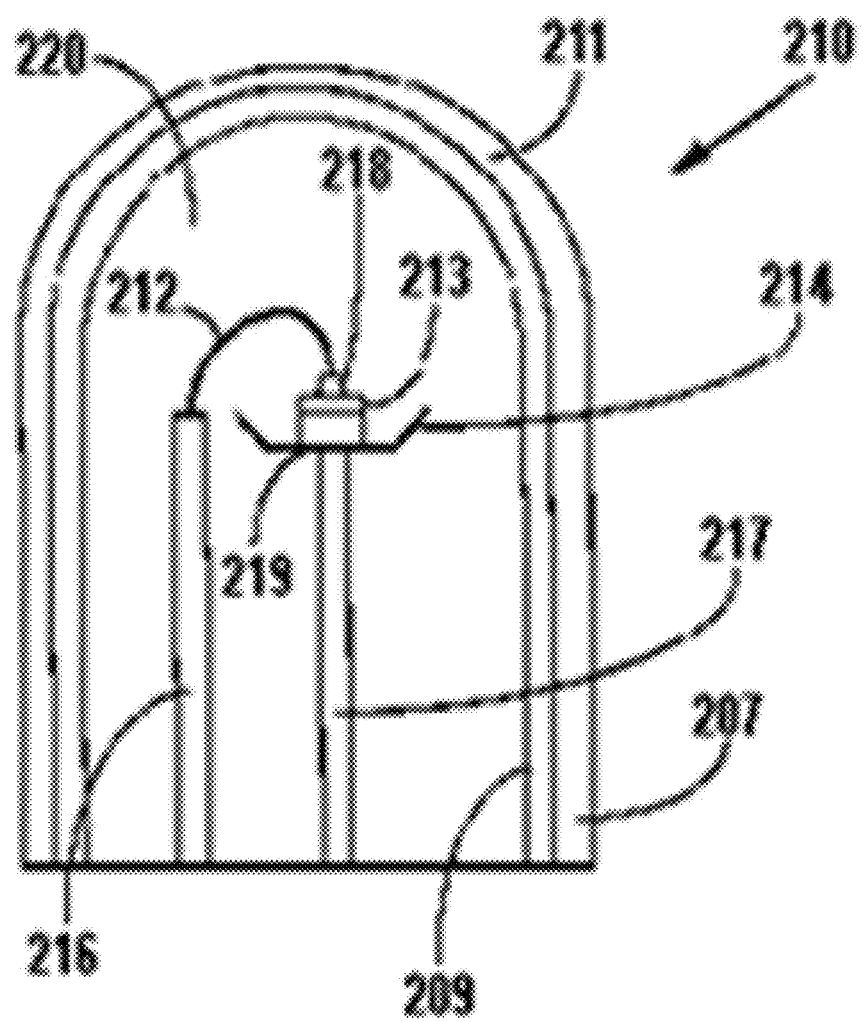

The arrangement of the illuminator built according to this principle and described, for instance, in U.S. Pat. No. 6,600, 175 (B1) is shown in FIG. 4.

This white light source comprises a shell 207 formed by a transparent medium 211, with an internal volume. The medium 211 can be formed by any suitable material that transmits light, such as transparent polymer or glass. The internal volume of the medium 211 comprises a light emitting diode (LED) 213 chip placed on the base 214. First and second electrical contacts 216 and 217 are connected to radiating and back sides 218 and 219 of the LED 213 chip, respectively, and to a radiating side 218 of the LED, which is next to the first electrical contact 216 by the conductor 212. The light transmitting medium 211 is associated with fluorescent and/or phosphorescent components, or mixtures thereof, in other words, photoluminescent phosphor medium which converts the radiation emitted by the side 218 of the LED 213 into white light.

Photoluminescent phosphor is scattered in the shell 207 of the medium 211 and/or is arranged in the form of a film coating 209 on the inner wall of the shell 207 surface. Alternatively, photoluminescent phosphor can be a coating on the outer wall of the assembly (not shown) shell if the shell is used exclusively in the environment, wherein such an outer coating can be satisfactorily maintained (e.g., where it is not subject to abrasion or degradation). For example, photoluminescent phosphor can be distributed in polymer, or glass melt, from which the shell is formed to provide a homogeneous composition of the shell and ensure light output from the entire surface of the shell.

Figure 5:
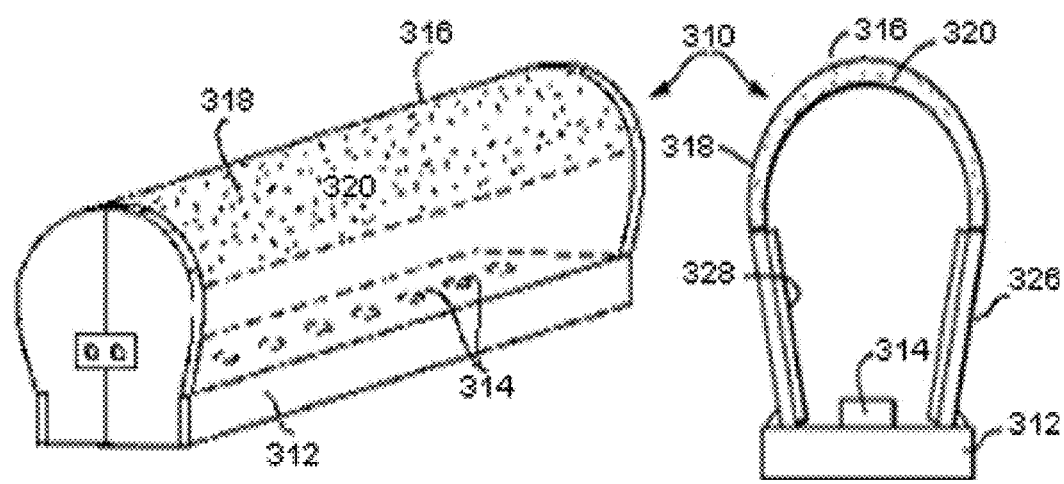

Elongated white LED illuminator with remote cylindrical converter is known in the art, as described in U.S. Pat. No. 7,618,157 B1. Its arrangement is schematically shown in FIG. 5. The illuminator 310 comprises a linear heat sink 312, a plurality of the LEDs 314 mounted on the heat sink 312 along the long side of the heat sink, and the light emitting dome 316 mounted on the heat sink 312 on one line with the LEDs 314, wherein a portion 318, half-round in section, of the dome 316 located against the LEDs 314 comprises a photoluminescent phosphor 320 which is excited by the light from the LEDs. The heat sink 312 is made of heat-conductive material, such as aluminum. The dome 316 is made of transparent material, such as glass or plastic. The photoluminescent phosphor 320 can be applied as a coating on the inner side of the dome or introduced into the coating material. The flat portions 326 without photoluminescent phosphor which are attached to the heat sink on both sides of the LEDs have internal reflective surfaces 328, for example, aluminum coatings reflecting light which comes from the LEDs 314 to the dome portion 318.

The conversion layer can comprise photoluminescent phosphor material, quantum dot material, or a combination of such materials, and can further comprise a transparent host material, wherein phosphor material and/or quantum dot material are dispersed.

It is known that the layers that contain powdered photoluminescent phosphor materials can conduct, absorb, reflect and dissipate the light incident on them. When this layer dissipates the light, it can also conduct, absorb and reflect some of the scattered light.

Due to this fact a common disadvantage of said known inventions is that the radiation excited in photoluminescent phosphor grains under the influence of LED radiation as well as reflected LED radiation are inevitably partially absorbed in the photoluminescent phosphor layer and on inner elements of the apparatus, which reduces efficiency of the white light source.

Yamada [1] and Narendran [2] determined the ratio of portions of the radiation propagating back and forth from the conversion layer of the photoluminescent phosphor YAG:Ce excited by blue light radiation with a wavelength of about 470 nm, which is converted into yellow wavelength range radiation. Narendran proved that in this case more than 60% of the light emitted and reflected by the conversion layer extends back to the excitation source, and a large portion of this light is lost within the LED assembly [2]. In [3] it is proved that even in the case of YAG:Ce photoluminescent phosphor with optical refractive index 1.8, which is mixed in epoxy resin with optical refractive index 1.6 at the photoluminescent phosphor density of 8 mg/cm2, which allows creating a balanced white light portions of back-directed and passed forth radiation, including blue and yellow light radiation, are 53% and 47%, respectively, while for the yellow light only such portions are 55% and 45%, respectively.

Therefore, a significant gain in light flux and maximum possible efficiency of LED conversion white light sources can be achieved in all conditions being equal, by directing the radiation coming from the photoluminescent phosphor surface immediately irradiated by LED radiation to the exit aperture of the LED light source to a remote converter.

Similar technical solution is proposed in U.S. Pat. No. 7,293,908 B2 in which one of the claimed embodiments of the lighting system with side light radiation coupling, which is completed according to this patent, includes a conversion layer which is remote from the LED and located on the light reflector.

This apparatus is most similar to the apparatus according to the present invention and, therefore, chosen as the prototype.

Figure 6:
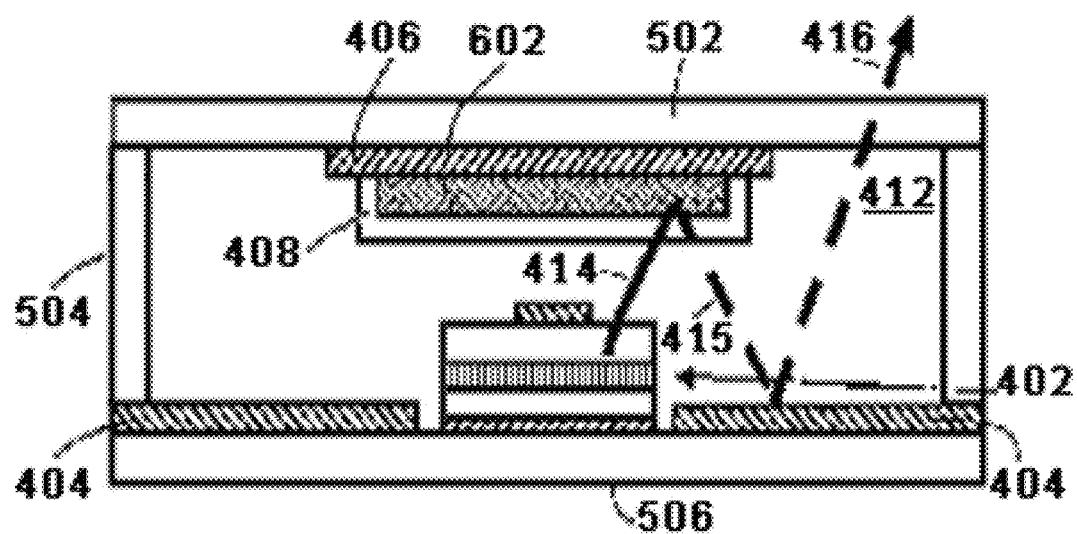

The operating principle of the white light source with side light radiation coupling implemented in accordance with the present patent is explained in FIG. 6, which shows a cross-section of one of the claimed embodiments of the lighting system with side light radiation coupling.

The lighting system with side light radiation coupling comprises a LED 402, the first reflector 404, the second reflector 406, an exit aperture 412, a conversion layer 602, an additional transparent covering layer 408, and supporting means which support and separate the second reflector 406 from the first reflector 404. The supporting means include a flat transparent element 502, side supports 504 and a base 506. The side supports 504 are, preferably, transparent or reflective. The first reflector 404 is attached to the base 506. The second reflector 406 is attached to the flat transparent element 502. The conversion layer 602 is located on the second reflector 406 surface and converts at least a portion of the primary radiation emitted by the active area of the LED 402 into radiation with the wavelength different from the primary radiation wavelength.

For the illustrative purposes let us consider light beams 414, 415 and 416 which explain the operation of the lighting system with side light radiation coupling. The light beam 414 of the first color is emitted by the LED 402 active area and directed to the LED 402 output surface. The light beam 414 of the first color passes through the LED 402 output surface and is directed to a transparent covering layer 408. The light beam 414 of the first color passes through the transparent covering layer 408 and is directed to the conversion layer 602 which converts the light beam 414 of the first color in the light beam 415 of the second color different from the first color. Light of the second color can be emitted in any direction from the point of wavelength conversion. The beam 415 of the second color is directed through the transparent covering layer 408 and, then, directed through the exit aperture 412 to the first reflector 404. The light beam 416 of the second color is reflected by the first reflector 404 and directed to the flat transparent element 502. The light beam 416 of the second color passes through the flat transparent element 502 and comes out the lighting system with side light radiation coupling.

The disadvantage of this system is large aperture losses and loss of light at the boundaries of the supporting means and on the reflectors.

An attempt to overcome these disadvantages was made in another known white light source of searchlight type described in U.S. Pat. No. 7,810,956 B2.

Figure 7:
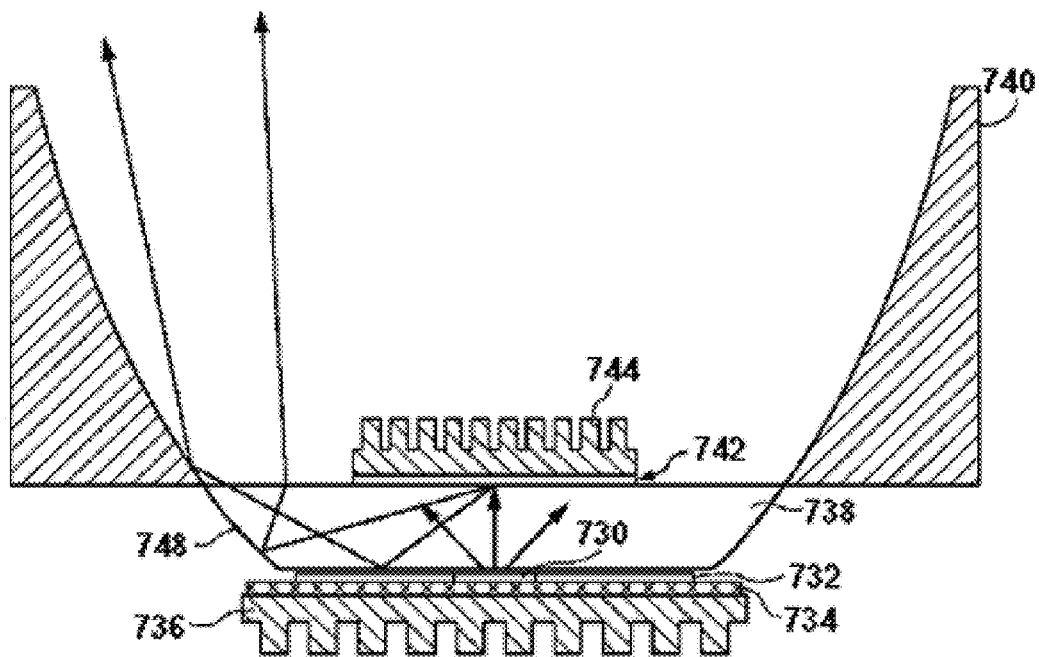

FIG. 7 illustrating the arrangement and the operating principle of such apparatus, is a cross-section view of a searchlight lamp according to one of the embodiments of the invention claimed in the U.S. Pat. No. 7,810,956 B2. The light source 730 is placed on a fastener 734 and an additional thermal heat sink 736. The thermal heat sink 736 can be finned, as shown in FIG. 7. The light emitted by the source 730 and reflected from the mirror 732 surrounding the light source 730 is radiated in an optical plate 738. The wavelength conversion layer 742 is separated from the light source 730 and placed so the light from the source 730 can be received. The additional thermal heat sink 744 can cool the conversion layer 742. The collecting optics 740 collimates the light. As the light source 730, a LED which generates shortwave light, e. g. blue or ultraviolet light, can be used. The light source 730 can be placed on the additional fastener 734 and attached to the additional thermal heat sink 736. The optical plate 738 can be formed so that it directs light to the collecting optics 740. For example, the sides 748 can be inclined or bent so that the total internal reflection directs light to the collecting optics 740.

The disadvantage of this system is large aperture losses and loss of light at the boundaries of the optical plate with the light source, mirrors, and the conversion layer, which eliminate its efficiency. Furthermore, the light beam outgoing from the collimating optical system is rather thin, which is not acceptable when using this illuminator as a replacement for standard lamps with small form factor, which have sufficient angular aperture of emitted light beam, even if the halogen lamps are used.

The proposed invention is based on the objective to provide maximum efficiency of LED white light source with a remote converter, to provide high color uniformity and rendering, as well as wide angular aperture of the light beam when form factor of the illuminator is small.

An illuminator proposed in the present invention comprises a primary radiation source with one or more LEDs, a heat-removing base with flat peripheral part which the said LEDs are attached to, a reflector 50 with light-reflective surface facing the LEDs, a conversion layer converting the primary radiation into the secondary radiation, which is placed remotely to the LEDs. The set problem is solved so that the heat-removing base for light radiation coupling has an aperture which edge is in close proximity of the LEDs being placed on the heat-removing base, and the specified surface of the conversion layer, which is irradiated by the LEDs, and the reflector surface have a concave shape with the concave side facing the primary radiation source and the aperture.

Figure 8:
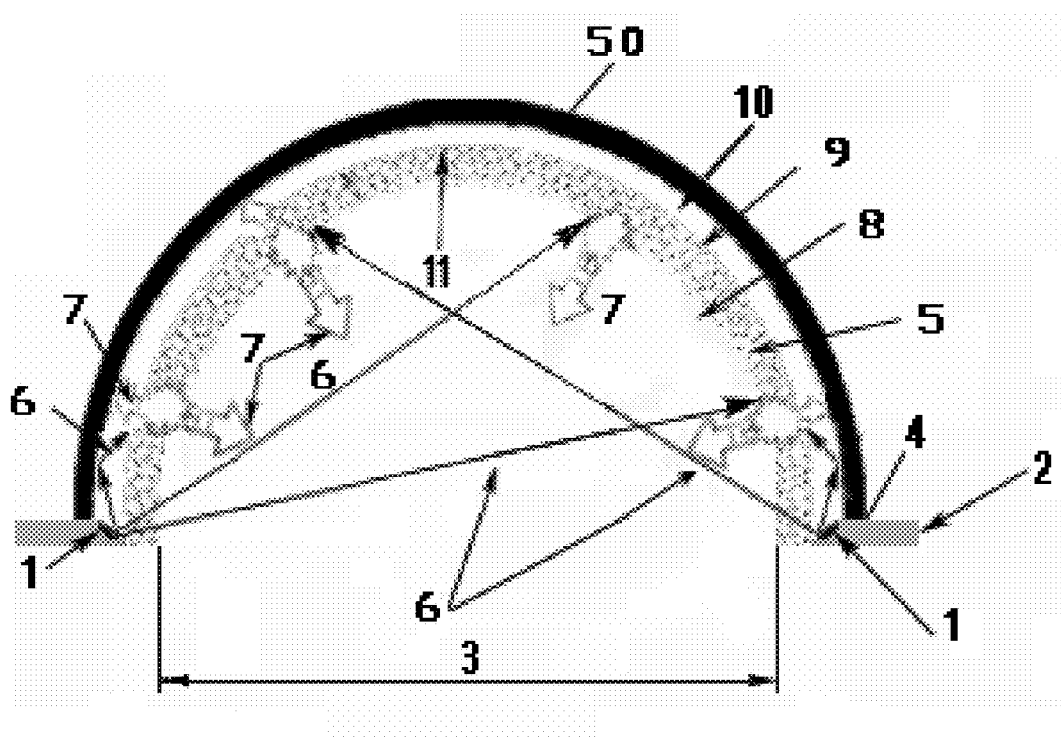

The disclosure of the invention is explained in FIG. 8 which schematically shows cross-section of the proposed illuminator.

The illuminator comprises a primary radiation source with one or more LEDs 1, a heat-removing base 2 with an aperture 3 and a periphery part 4 which the said LEDs 1 are attached to, a conversion layer 5 converting primary radiation 6 into secondary radiation 7, which has a concave surface 8 facing the LEDs 1, and a second convex surface 9 wherein the conversion layer 5 is placed remotely to the LEDs 1.

The illuminator functions as follows: the primary radiation 6 of the LED 1 reaches the surface 8 of the conversion layer 5, then reflects partially from the surface 8, exiting through the aperture 3 of the heat-removing base 2, reflects partially from the surfaces of photoluminescent phosphor grains, being dissipated in the conversion layer 5, is absorbed partially by the conversion layer 5 material transforming into secondary radiation 7; concurrently, a portion of the primary radiation 6 which has reached the surface 9, exits outside together with a part of the secondary radiation 7 produced by the conversion layer 5 forming white radiation as their mix. In this case, a certain portion of the primary radiation 6 exits the conversion layer through the aperture 3 of the illuminator and mixes with the secondary radiation 7 to form white radiation. The spectral distribution of white radiation is determined by the properties of the conversion layer materials, primarily, by their composition, the photoluminescent phosphor dispersion and the thickness of the conversion layer. Thickness adjustment of the conversion layer in range from 5 up to 500 μm gives a possibility to make closer each other the color coordinates of white light going through the aperture orifice and leaving the outer surface of the conversion layer 9.

Photoluminescent phosphors are usually optical inorganic materials doped with ions of rare earth elements (lanthanides), or, alternatively, ions of the elements, such as chromium, titanium, vanadium, cobalt or neodymium. Lanthanide elements are lanthanum, cerium, praseodymium, neodymium, promethium, samarium, europium, gadolinium, terbium, dysprosium, holmium, erbium, thulium, ytterbium and lutetium. Optical inorganic materials include (but are not limited to): sapphire ($Al_2O_3$), gallium arsenide (GaAs), beryllium aluminum oxide ($BeAl_2O_4$), magnesium fluoride ($MgF_2$), indium phosphide (InP), gallium phosphide (GaP), yttrium aluminum garnet (YAG or $Y_3A_{15}O_{12}$), terbium-containing garnet, yttrium-aluminum-lanthanide oxide compounds, compounds of yttrium, a lanthanide-aluminum-gallium oxides, yttrium oxide ($Y_2O_3$), calcium or strontium or barium halophosphates $(Ca,Sr,Ba)_5(PO_4)_3(Cl,F)$, the composition $CeMgAl_{11}O_{19}$, lanthanum phosphate ($LaPO_4$), lanthanide pentaborate materials ((lanthanide)(Mg, Zn) $B_5O_{10}$), the composition $BaMgAl_{10}O_{17}$, the composition $SrGa_2S_4$, compounds $(Sr,Mg,Ca,Ba)(Ga,Al,In)_2S_4$, the composition SrS, the composition ZnS and nitride silicates.

There are several typical photoluminescent phosphors which can be excited by UV radiation with a wavelength of 250 nm or close to this. A typical red-emitting photoluminescent phosphor is $Y_2O_3:Eu^{+3}$. A typical yellow-emitting photoluminescent phosphor is $YAG:Ce^{+3}$. Typical green-emitting photoluminescent phosphors include: $CeMgAl_{11}O_{19}$: Tb<3+>, (lanthanide) $PO_4:Ce^{+3},Tb^{+3}$ and $GdMgB_5O_{10}$: $Ce^{+3},Tb^{+3}$. Typical blue-emitting photoluminescent phosphors are $BaMgAl_{10}O_{17}Eu^{+2}$ and $(Sr,Ba,Ca)_5(PO_4)_3Cl:Eu^{+2}$. For a LED of excitation with a longer wave with the wavelength range of 400-450 nm or close to it, the typical optical inorganic materials include yttrium aluminum garnet (YAG or $Y_3Al_5O_{12}$), terbium-containing garnet, yttrium oxide ($Y_2O_3$), $YVO_4$, $SrGa_2S_4$, $(Sr,Mg,Ca,Ba)(Ga,Al,In)_2S_4$, SrS, and nitride silicates. Typical photoluminescent phosphors for LED of excitation in the wavelength range of 400-450 nm include $YAG:Ce^{+3}$, $YAG:Ho^{+3}$, $YAG:Pr^{+3}$, $SrGa_2S_4:Eu^{+2}$, $SrGa_2S_4:Ce^{+3}$, $SrS:Eu^{+2}$ and nitride silicates doped with $Eu^{+2}$.

Quantum-dot materials are inorganic semiconductor fine particles of less than about 30 nm. Typical quantum-dot materials include (but are not limited to) particles of CdS, CdSe, ZnSe, InAs, GaAs and GaN. Quantum-dot materials can absorb light of one wavelength and then re-emit the light with different wavelengths, which depend on the particle size, particle surface properties, and the inorganic semiconductor material.

The conversion layer can include both one type of photoluminescent phosphor material or quantum-dot material and a mixture of photoluminescent phosphor materials and quantum-dot materials. Using a mixture of more than one of such material is appropriate if it is desirable to have a wide spectral range of the emitted white light (high color rendering). One of the typical approaches to obtain warm white light with high color rendering index is mixing radiation of InGaN LED with the radiation of the mixture of yellow and red conversion photoluminescent phosphors. The conversion layer can include several photoluminescent phosphors that absorb the light emitted by the LED and emit light with a longer wavelength. For example, for blue LEDs, the conversion layer can include a single photoluminescent phosphor emitting yellow light, or several photoluminescent phosphors that emit red and green light. For ultraviolet LEDs, the conversion layer can include photoluminescent phosphors emitting blue and yellow light, or photoluminescent phosphors emitting blue, green, and red light. Photoluminescent phosphors can be added that emit additional colors, in order to control the color coordinates and the rendering of the mixed light outgoing from the illuminator.

Transparent host materials can include polymer and inorganic materials. Polymer materials include (but are not limited to): acrylates, polycarbonate, fluoroacrylates, perfluoroacrylates, fluorophosphinate polymers, fluorosilicones, fluoropolyimides, polytetrafluoroethylene, fluorosilicones, sol-gels, epoxy resins, thermoplastics, heat-shrink plastics and silicones. Fluorine-containing polymers are especially useful in the ultraviolet ranges of wavelengths shorter than 400 nm and infrared wavelengths longer than 700 nm, due to their low absorption of light at these wavelength ranges. Typical inorganic materials include (but are not limited to): silicon dioxide, optical glasses, and chalcogenide glasses.

For providing of necessary mechanical durability of the remote converter the photoluminescent phosphor of the conversion layer can conformally be applied as coating to the inner surface of an optically transparent window, such as a hemispherical glass cap, e.g., by pulverizing, pasting, deposition or electrical endosmosis from the photoluminescent phosphor suspension in the liquid. One of the problems related to coating the reflector with photoluminescent phosphor is applying a uniform reproducible coating on the carrying element, especially if the carrying element has a non-planar surface, for example, cylindrical or hemispherical. Liquid suspensions are used to apply photoluminescent phosphor particles to the substrate when the pulverizing, pasting, deposition methods are applied. The uniformity of coating greatly depends on the viscosity of the suspension, particle concentration in suspension, and environmental factors, such as ambient temperature and humidity. Coating defects due to flows in the suspension before drying, and daily changes of the coating thickness are classified as ordinary problems.

The carrying elements can be manufactured from glass, transparent ceramics or transparent plastics, such as polycarbonate, PET, polypropylene, polyethylene, acrylic, shaped by extrusion.

The carrying element can be manufactured from a matted material or a transparent material with the matted surface for better illumination uniformity.

In some cases, it is preferable the homogeneous dispersion of the photoluminescent phosphor inside a material of the carrying element, for example, transparent plastic, such as polycarbonate, PET, polypropylene, polyethylene, acrylic, shaped by extrusion. In this case, the conversion layer can be pre-manufactured in sheets, which are then heat molded into the desired shape.

The conversion layer of the conformally preformed the inner surface of the carrying element can be attached to it, for example, with a silicone adhesive located between the conversion layer and the inner surface of the carrying element. In this case, the adhesive layer can be thin, thinner, for example, than the conversion layer, and can not maintain a large thermal resistance to the heart removal from the conversion layer.

In one of specific embodiments of the illuminator, a preformed sheet is used, which is pasted to a glass or polycarbonates cylindrical carrying element. An organic solvent is used to prepare the suspension of photoluminescent phosphor, surface-active agents (surfactants) and the polymer. The suspension can then be formed into a sheet by extrusion or mold casting or it can be poured on a flat substrate, for example, a glass one, followed by drying. The resulting sheet can be separated from the temporary substrate and attached to the carrying element, using a solvent or cyanoacrylate adhesive.

Figure 9:
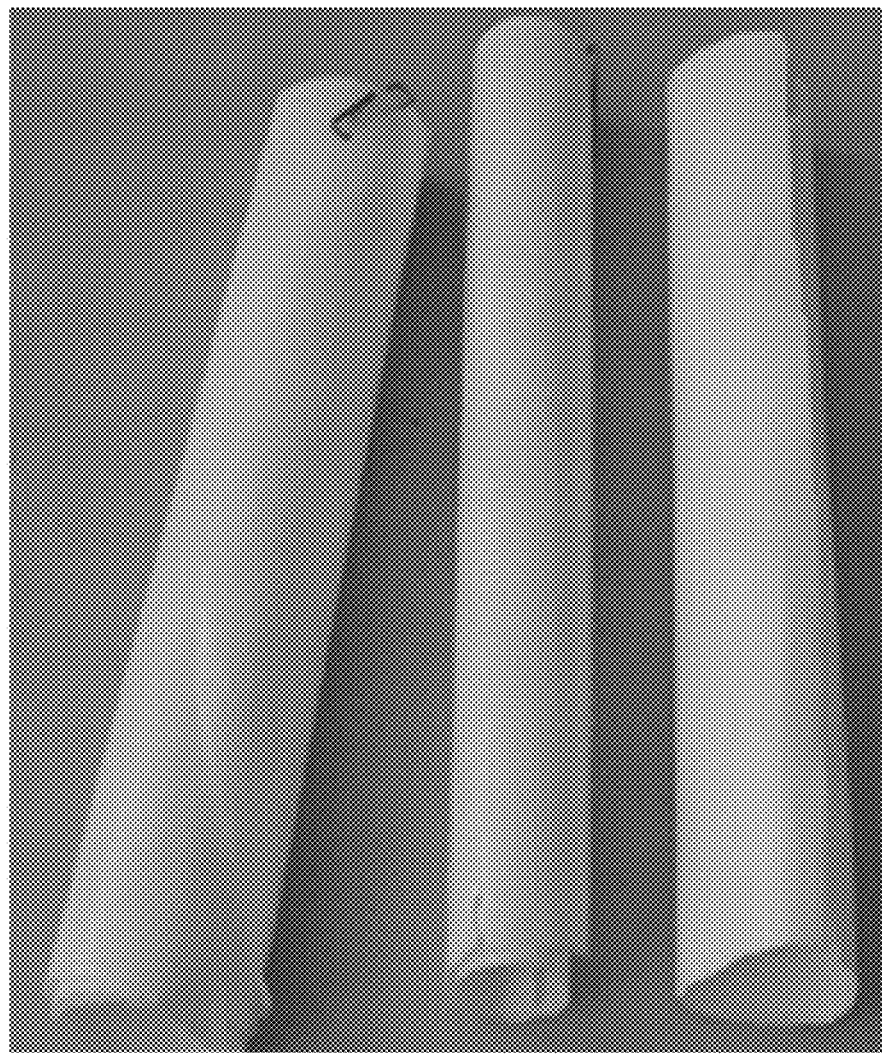

In a specific example, sheets of different thicknesses, as shown in FIG. 9, were formed by extrusion from the suspension of particles of an experimental photoluminescent phosphor based on yttrium-gadolinium-cerium aluminium garnet $(Y,Gd,Ce)_3Al_5O_{12}$ in a polycarbonate solution in methylene chloride. The conversion layer must be sufficiently thick to achieve the necessary color coordinate values of mixed white light outgoing from the illuminator aperture. The effective thickness is defined based on optical scattering processes in photoluminescent phosphors used and ranges, for example, between 5 and 500 µm, most often between 100 and 250 µm.

The sheet was secured to a cylindrical carrying element by way of moistening the carrying element' inner side with isopropanol and applying pressure to the sheet using a male die of a desired shape. The solvent softens the sheet and allows squeezing out air bubbles from under it to ensure full adhesion of the sheet to the carrying element. The glass carrying element can be coated with a mixture of photoluminescent phosphor with transparent silicone binder; then, the mixture is annealed. In this case, the silicone binder is not removed by annealing. It must be borne in mind that photoluminescent phosphor, which converts blue light in the orange-red one, can degrade until complete uselessness after is has been heated to 480° C. in air. In this case, other polymers with a lower burning-off temperature must be used. In some cases, the burning-off temperature ranges from 260° C. to 540° C.

The surface of the conversion layer can be additionally coated with a transparent protective layer, which prevents the ingress of moisture and/or oxygen into the conversion layer, as some types of photoluminescent phosphors, e.g., sulfide one, are prone to damage from moisture attacks. The protective layer can be made of any transparent material which prevents moisture and/or oxygen from penetrating into the conversion layer, for example, made of inorganic materials, such as silicon dioxide, silicon nitride or aluminum oxide, and organic polymers or combinations of polymeric and inorganic layers. The preferable materials for the protective layer are silicon dioxide and silicon nitride.

The protective layer can also optically clear the boundary of a photoluminescent phosphor grain with the atmosphere and can reduce the reflection of the LED primary radiation and the secondary radiation of the photoluminescent phosphor on this boundary, reducing the absorption losses of the photoluminescent phosphor self-radiation in its grains, thereby increasing the efficiency of the illuminator.

The protective layer can also be applied by finishing surface treatment of photoluminescent phosphor grains, which, among other things, causes to form a nano-sized 50-100 nm film of zinc silicate on the surface of the grains, that clears the boundary of the photoluminescent phosphor grain.

Where necessary, the aperture can be additionally hermetically sealed with an optically transparent window that protects the conversion layer from moisture and/or oxygen, while the internal volume of the illuminator can be filled with an inert atmosphere, or evacuated. An inert atmosphere and vacuum are optically transparent for radiation of used LEDs and photoluminophores.

The said protective window can be manufactured from a matted material or a transparent material with the matted surface for better illumination uniformity.

The surface 8 of the converter 5 and the surface 11 of the carrying element 10 can be shaped as axisymmetric figures (a sphere, ellipsoid, paraboloid, or otherwise), truncated by a plane of the heat-removing base 2; in this case, the LEDs 1 are located near and along the line of intersection of the said surface of the heat-removing base 2 with the said surface 8 of the converter 5.

The optimization of the converter thickness and surface 8 shape and of the location of the LED based on their radiation directivity diagram allows improving the color uniformity and angular distribution of the radiation coming out of the illuminator due to the incidence of the LED radiation to the converter surface 8 at different angles and redistribution of the reflected radiation inside the cavity of the converter 5 before its exit from the aperture and through the thickness of the converter 5.

As known from the specifications, say, for SemiLEDs chips of strong blue LED SL-V-B45AC2 or EZBright1000 family chips manufactured by CREE, the radiation directivity diagram of LED chips can have the Lambertian distribution (a light cone with an angle of obliquity of 90° to the surface of the LED chip) or be limited to a less cone with the angle $\alpha$ <90°, for example, when radiation is coupled out using a quantum-sized lattice structure formed on the surface of the LED chip.

In this case, the LED can be located on the heat-removing base in such a way that the axis of the LED radiation directivity diagram intersects the axis of symmetry of the reflector at an angle $\beta \geq 90° - \alpha/2$.

Figure 10:
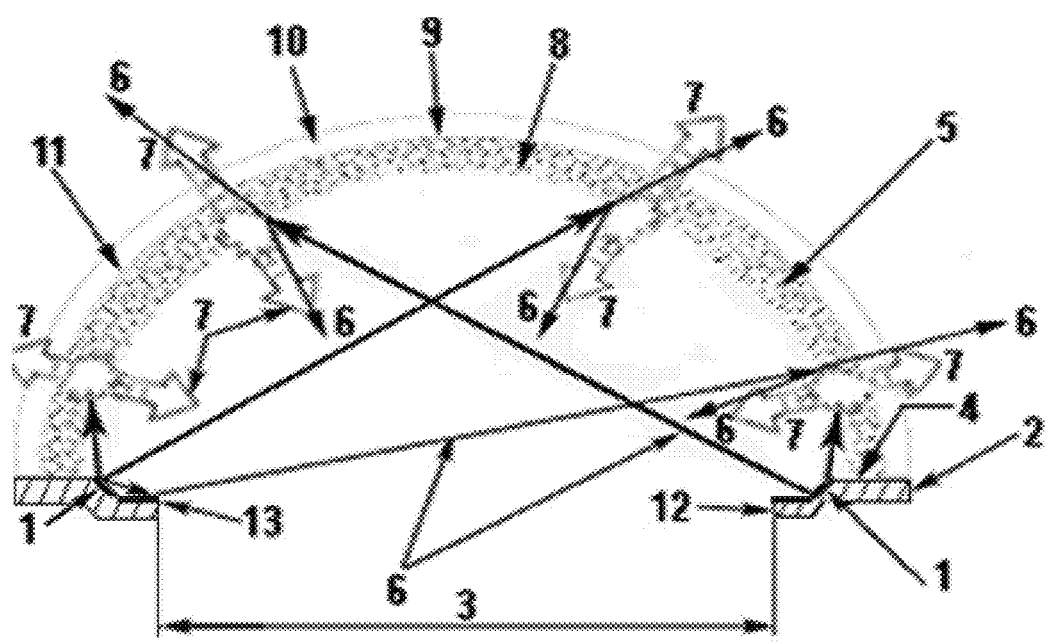

However, a certain relatively small part of the LED primary radiation propagates directly outwardly the illuminator aperture; and to avoid the possible user's direct eye contact with the LED light, the heat-conducting base 2 can comprise a protrusion 12 that screens the direct yield of the primary radiation outwards the illuminator, bypassing the surface 8 of the converter 5, as it is shown in FIG. 10. To ensure a more complete utilization of the LED primary radiation, the said protrusion 12 of the heat-conducting base 2 comprises an additional reflector—a flat mirror part 13 that directs the primary radiation falling on it towards the surface 8 of the converter 5.

The illuminator in this embodiment includes an optically transparent carrying element 10, with the inner side 11, which contacts to the surface 9 of the converter 5, and a protruding part 12 with a reflective coating 13 in addition to the elements shown in FIG. 8 and numbered in the same way as in FIG. 8.

Figure 11:
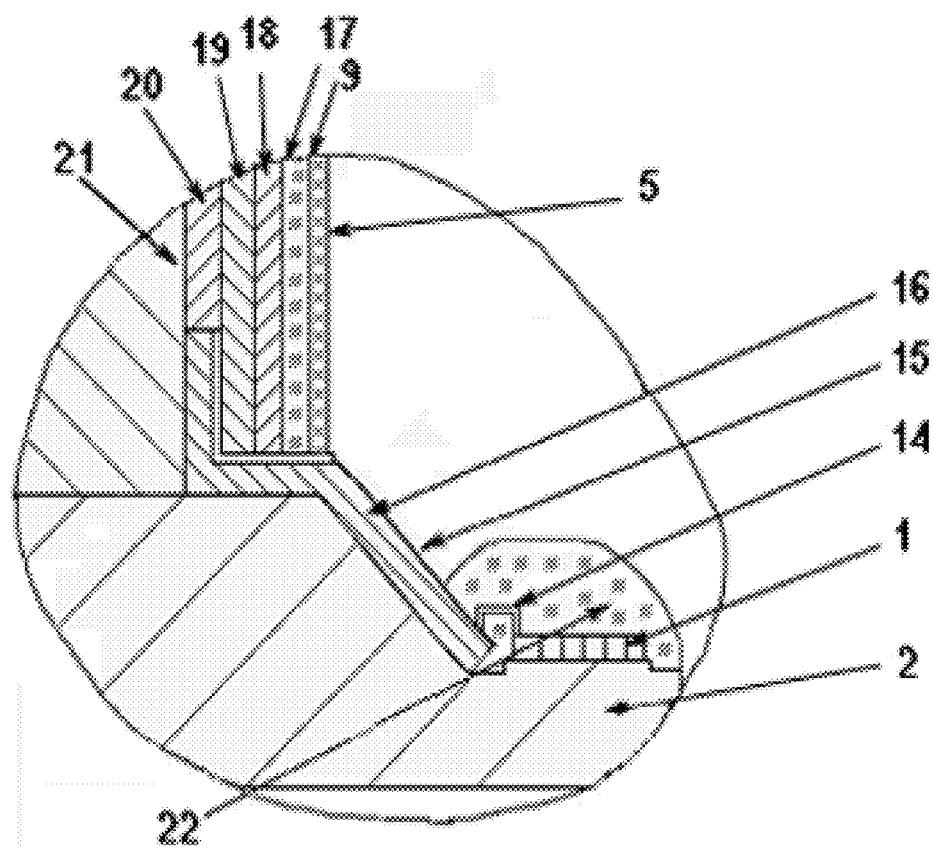

Another specific embodiment of the illuminator with an additional reflector is shown in details in FIG. 11, which shows an enlarged sectional view of the illuminator in the area of the base 2 with fixed LEDs 1 where the corresponding components are numbered in the same way as in FIG. 8 (not to scale).

The additional reflector is an inclined surface 15 (for example, a truncated conical surface put the base upwards in the case of an axisymmetrically shaped converter) located between the LED chips 1 and the converter 5, the reflection from which allows almost completely redirecting the portion of the LED chips 1 radiation falling onto it to the opposite side of the converter 5, which homogenizes the outgoing radiation of the illuminator.

In this embodiment of the illuminator, the LED chips 1 are located on the base 2 so that the normal to the surface of the LED chip 1 is parallel (or makes a small angle) to the axis of symmetry of the converter 5 made as a film applied by one of the previously mentioned methods to the inner surface of a hemispherical glass cap 17, glued with an elastic heat-resistant compound 18 to the aluminum hemispherical contacting element 19, which in its turn glued with an elastic heat-resistant conductive compound 20 to the inner side of heat removing ribs 21, located between windows for light output from the outer side 9 of the converter 5, made in a heat radiator untended for heat dissipation in the illuminator. Windows for light output from the outer side 9 of the converter 5, are also made in the contacting element 19, located between heat removing ribs of the heat radiator, which act together as the second common electrode for the LED chips 1 that are connected to it in parallel by means of the conductors 14 and the polyimide ribbon 16 with the metallic coating 15.

Figure 12:
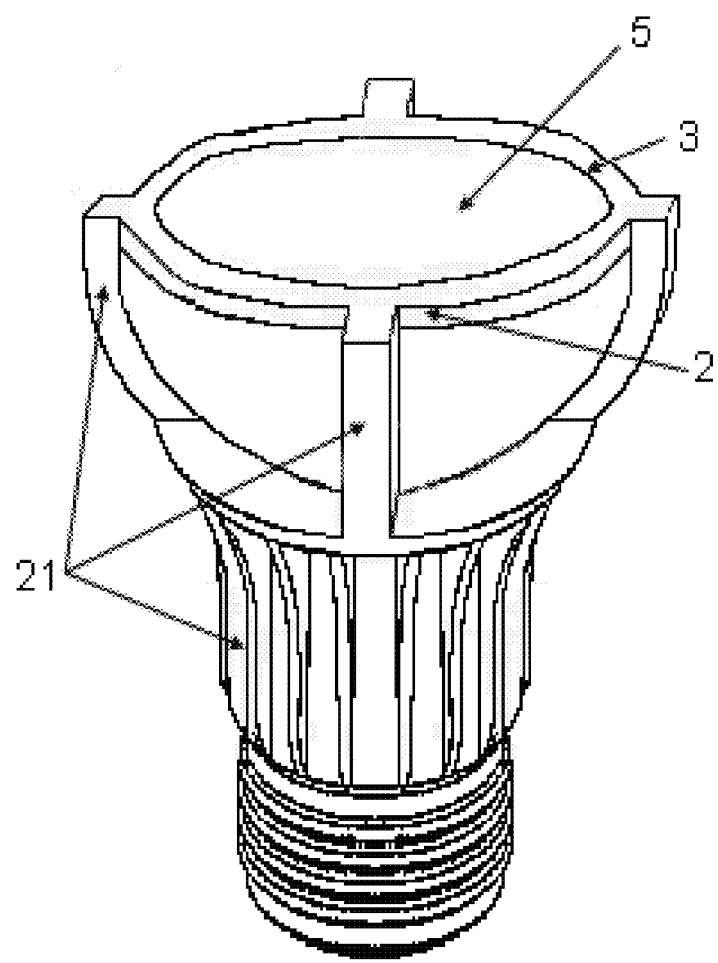

Windows for light output in the contacting element 19 and in the heat radiator, located between heat removing ribs 21 of the heat radiator are shown in the FIG. 12.

To enhance the light reflectivity, the metallic coating 15 on the polyimide ribbon is coated with a thin aluminum layer and serves as an additional reflector in addition to being the electric contact. With this layout of the LEDs, their primary radiation does not directly enter the eye of an observer.

The first electrode is the base 2, to which the LED chips 1 are soldered, and ribs of the heat radiator that is in electrical and thermal contact with the base 2. Electrical power is supplied to the contacting element 19 by the central cylindrical output (not shown on FIG. 11) that is welded (or soldered) to the top of the contacting element 19 in axial alignment with the axis of symmetry of the converter 5 and connected through an electrically insulated hole in the inner surface of the heat radiator to the supply driver located in the corresponding cavity made in the upper part of the heat radiator body (not shown).

LED chips 1 and wire contacts 14 can be sealed with the optical compound 22 using the known technology applied in the manufacture of LED assemblies.

The hemispherical cap 17 can also be made of heat-conducting ceramic, or optically transparent plastic, such as polycarbonate, PET, polypropylene, polyethylene, acrylic or another similar material.

The contacting element 19 can also be made of stainless steel, copper, brass, Kovar, or any similar material.

The heat radiator 22 can be made of any suitable material, such as copper or aluminum. The heat radiator can be ribbed to increase the heat transfer surface, for example, as shown in FIG. 12.

The sheets shown in FIG. 9, using SL-V-B35AK-type LED chips manufactured by SemiLEDs, were used to manufacture samples of white linear semicylindrical illuminators, that achieved the effectiveness of 160-200 lm/W, depending on the sheet thickness.

REFERENCES

1. Yamada, K., Imai, Y. and Ishii K., "Optical Simulation of Light Source Devices Composed of Blue LEDs and YAG Phosphor," *J. Light & Vis. Env.* 27(2), 70-74 (2003).
2. Narendran, N., Gu. Y., Freyssinier, J., Zhu, Y., "Extracting Phosphor-scattered Photons to Improve White LED Efficiency," *Phys. Stat. Sol.* (a) 202(6), R60-R62 (2005).
3. Zhu Y., N. Narendran, and Y. Gu. "Investigation of the optical properties of YAG:Ce phosphor". Sixth International Conference on Solid State Lighting. *Proceedings of SPIE.* 6337, 63370S (2006).

The invention claimed is:

1. An illuminator comprising:
   a heat-removing base having a base surface, an aperture on the base surface dividing the base surface on a first end, a second end, a periphery, and angled edges formed near the periphery of the aperture;
   a primary radiation source including at least one light-emitting diode, the at least one light-emitting diode is located on the angled edge formed near the periphery of the aperture in the heat removing base;

a reflector having a light reflective surface facing the at least one light-emitting diode, the light reflective surface having a concave shape, the reflector having an inner side and an outer side;

a radiation conversion layer located between the at least one light-emitting diode and the inner side of the reflector, the radiation conversion layer is located remotely from the at least one light-emitting diode, the radiation conversion layer having a concave surface facing the at least one light-emitting diode, said radiation conversion layer converts a primary radiation, emitted by the at least one light emitting diode into a secondary radiation;

a carrying element located on the outer side of the reflector, the carrying element is manufactured from optically transparent material;

wherein:

said conversion layer includes at least one of a photoluminescent phosphor material or a quantum-dot material;

a first portion of the first radiation emitted by the at least one light-emitting diode reflects from the concave surface of the radiation conversion layer exiting through the aperture of the heat-removing base;

a second portion of the first radiation emitted by the at least one light-emitting diode is transformed into the second radiation by the photoluminescent phosphorous material or the quantum-dot material on the radiation conversion layer;

a third portion of the first radiation emitted by the at least one light-emitting diode reaches the concave surface of the light reflective surface of the reflector, reflects back to the conversion layer, is partially absorbed by the photoluminescent phosphorous material or a quantum-dot material on the radiation conversion and exits through the aperture of the heat-removing base and mixing with the second radiation forming a white radiation.

2. The illuminator according to claim 1, wherein said aperture is positioned in a plane, the conversion layer is shaped as an ellipsoid truncated by a plane parallel to the plane of said aperture, said ellipsoid is represented by a sphere or a paraboloid, and said ellipsoid includes main axes extending perpendicular to the plane of said aperture.

3. The illuminator according to claim 1, wherein said aperture is positioned in a plane, the conversion layer is shaped as a cylinder truncated by a plane parallel to the plane of said aperture.

4. An illuminator comprising:

a heat-removing base having a base surface, an aperture on the base surface dividing the base surface on a first end, a second end, a periphery, and angled edges formed near the periphery of the aperture the angled edge having an angle $\beta$, wherein $\beta$ is calculated by:

$\beta \geq 90° - \alpha/2$ wherein $\alpha$ is an angular width of the corresponding light-emitting diode;

a primary radiation source including at least one light-emitting diode, the at least one light-emitting diode is located on the angled edge formed near the periphery of the aperture in the heat removing base;

a reflector having a light reflective surface facing the at least one light-emitting diode, the light reflective surface having a concave shape, the reflector having an inner side and an outer side;

a radiation conversion layer located between the at least one light-emitting diode and the inner side of the reflector, the radiation conversion layer is located remotely from the at least one light-emitting diode, the radiation conversion layer having a concave surface facing the at least one light-emitting diode, said radiation conversion layer converts a primary radiation, emitted by the at least one light emitting diode into secondary radiation;

a carrying element located on the outer side of the reflector, the carrying element is manufactured from optically transparent material;

said conversion layer includes at least one of a photoluminescent phosphor material or a quantum-dot material;

wherein the heat-removing base includes a protrusion connected to a free end of the angled edge, the protrusion is horizontally aligned and includes a reflective flat top surface;

said conversion layer includes at least one of a photoluminescent phosphor material or a quantum-dot material;

a first portion of the first radiation emitted by the at least one light-emitting diode reflects from the concave surface of the radiation conversion layer exiting through the aperture of the heat-removing base;

a second portion of the first radiation emitted by the at least one light-emitting diode is transformed into the second radiation by the photoluminescent phosphorous material or the quantum-dot material on the radiation conversion layer;

a third portion of the first radiation emitted by the at least one light-emitting diode reaches the concave surface of the light reflective surface of the reflector, reflects back to the conversion layer, is partially absorbed by the photoluminescent phosphorous material or the quantum-dot material on the radiation conversion and exits through the aperture of the heat-removing base and mixing with the second radiation forming a white radiation.

5. The illuminator according to claim 1, wherein said carrying element is made of a matted material or optically transparent material with the matted surface.

6. The illuminator according to claim 1, wherein:

said at least one light-emitting diode each is characterized with a radiation directivity diagram having a diagram axis and a diagram angular width;

and wherein:

said at least one light-emitting diode each is positioned such that the diagram axis thereof intersects the converter's symmetry axis at an angle not exceeding a difference between 90° and a half of the diagram angular width of the corresponding light-emitting diode.

7. The illuminator according to claim 1, wherein said aperture is sealed with a window made of an optically transparent or matted material or transparent material with the matted surface.

8. An illuminator comprising:

a heat-removing base having a base surface, an aperture on the base surface dividing the base surface on a first end, a second end, a periphery, and angled edges formed near the periphery of the aperture, the angled edge having an angle $\beta$, wherein $\beta$ is calculated by:

$\beta \geq 90° - \alpha/2$ wherein $\alpha$ is an angular width of the corresponding light-emitting diode;

a primary radiation source including at least one light-emitting diode, the at least one light-emitting diode is located on the angled edge formed near the periphery of the aperture in the heat removing base;

a reflector having a light reflective surface facing the at least one light-emitting diode, the light reflective surface having a concave shape, the reflector having an inner side and an outer side;

a radiation conversion layer located between the at least one light-emitting diode and the inner side of the reflector, the radiation conversion layer is located remotely from the at least one light-emitting diode, the radiation conversion layer having a concave surface facing the at least one light-emitting diode, said radiation conversion layer converts a primary radiation, emitted by the at least one light emitting diode into a secondary radiation;

a carrying element located on the outer side of the reflector, the carrying element is manufactured from optically transparent material;

wherein:

said conversion layer includes at least one of a photoluminescent phosphor material or a quantum-dot material;

a first portion of the first radiation emitted by the at least one light-emitting diode reflects from the concave surface of the radiation conversion layer existing through the aperture of the heat-removing base;

a second portion of the first radiation emitted by the at least one light-emitting diode is transformed into the second radiation by the photoluminescent phosphorous material or the quantum-dot material on the radiation conversion layer;

a third portion of the first radiation emitted by the at least one light-emitting diode reaches the concave surface of the light reflective surface of the reflector, reflects back to the conversion layer, is partially absorbed by the photoluminescent phosphorous material or the quantum-dot material on the radiation conversion and exists through the aperture of the heat-removing base and mixing with the second radiation forming a white radiation;

wherein radiation conversion material layer thickness ranges between 5 and 500 μm.

9. The illuminator according to claim 4, wherein the reflective flat top surface is a mirror.

* * * * *